(12) United States Patent
Anderson et al.

(10) Patent No.: US 7,993,989 B2
(45) Date of Patent: Aug. 9, 2011

(54) VERTICAL SPACER FORMING AND RELATED TRANSISTOR

(75) Inventors: Brent A. Anderson, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 12/540,613

(22) Filed: Aug. 13, 2009

(65) Prior Publication Data

US 2011/0037104 A1    Feb. 17, 2011

(51) Int. Cl.
*H01L 21/00* (2006.01)
(52) U.S. Cl. .................................................. 438/149
(58) Field of Classification Search .................. None
See application file for complete search history.

(56) References Cited

U.S. PATENT DOCUMENTS

| | | | |
|---|---|---|---|
| 2002/0028541 A1* | 3/2002 | Lee et al. | 438/149 |
| 2005/0201155 A1* | 9/2005 | Shih | 365/185.16 |
| 2005/0263795 A1* | 12/2005 | Choi et al. | 257/213 |
| 2006/0154423 A1 | 7/2006 | Fried et al. | |
| 2009/0224339 A1* | 9/2009 | Gogoi et al. | 257/413 |

* cited by examiner

*Primary Examiner* — Charles D Garber
*Assistant Examiner* — Andre' C Stevenson
(74) *Attorney, Agent, or Firm* — Richard W. Kotulak; Hoffman Warnick LLC

(57) ABSTRACT

Methods include, for example, forming a vertically disposed active region on a substrate; forming a first gate over a portion of the vertically disposed active region; forming a dielectric over the portion; exposing an upper surface of the first gate; forming a second gate over the upper surface; and forming a spacer pocket region between the vertically disposed active region, the first gate and the dielectric, wherein the spacer pocket region is self-aligned to a lower surface of the second gate and has a substantially uniform thickness from an upper to a lower extent thereof.

19 Claims, 10 Drawing Sheets

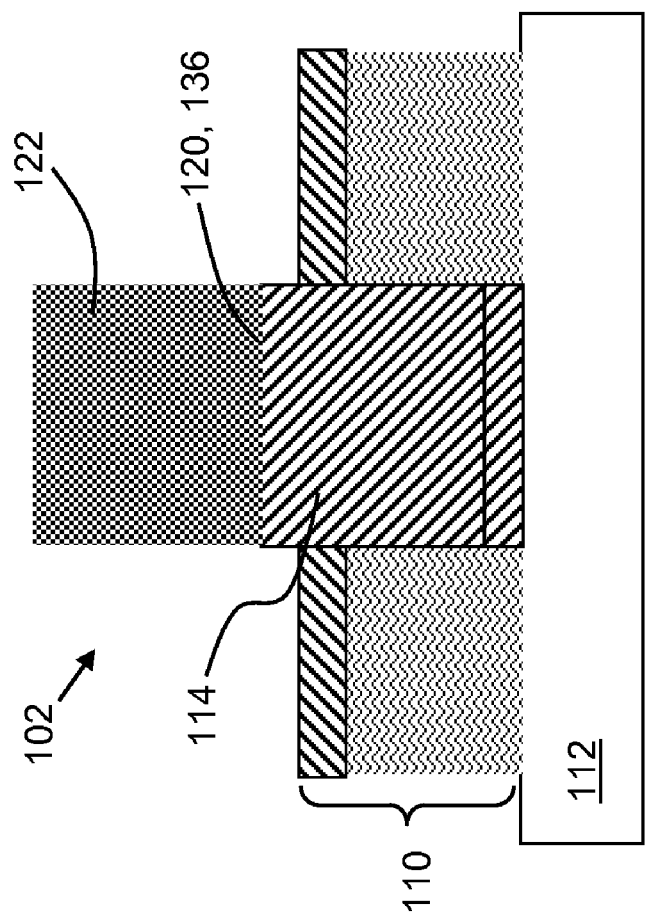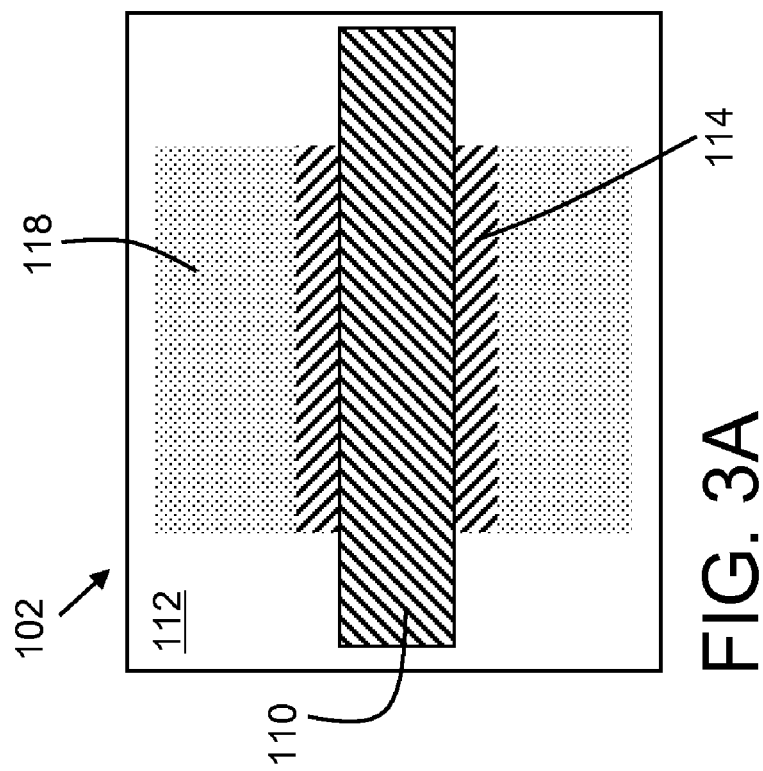

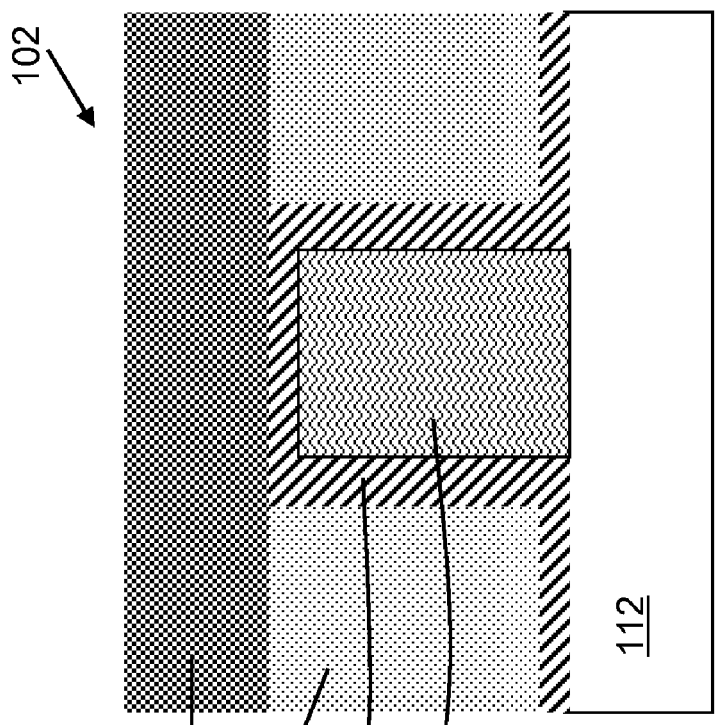
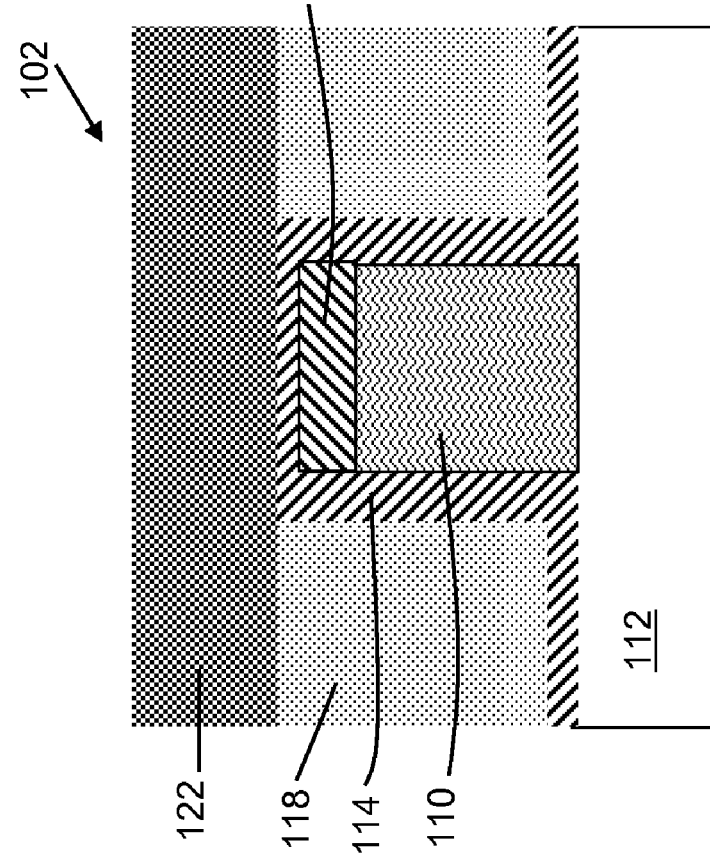

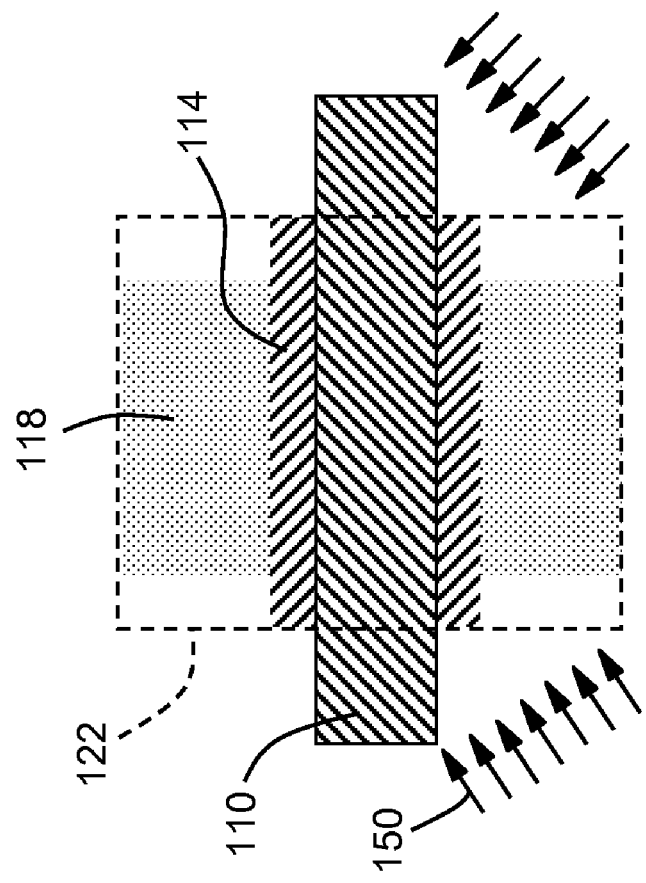
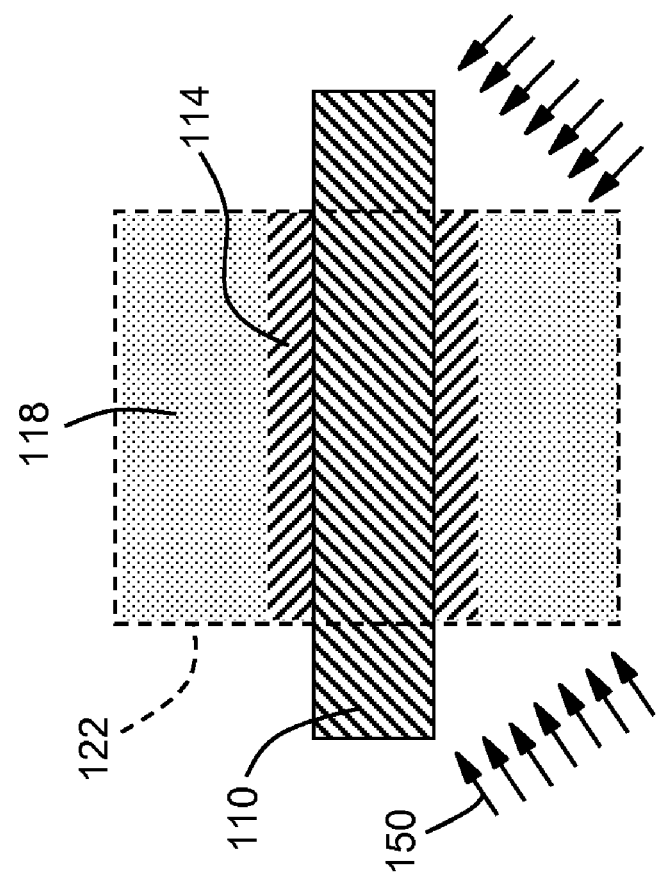

VERTICAL SPACER FORMING AND RELATED TRANSISTOR

BACKGROUND

1. Technical Field

The disclosure relates generally to integrated circuitry, and more particularly, to methods of forming a vertical spacer and a related transistor.

2. Background Art

Spacers are common structures in complementary metal-oxide semiconductor (CMOS) processing provided to protect one structure from processing done to an adjacent structure. Illustrative types of CMOS devices in which protective spacers must be used include fin field effect transistors (FinFETs), multi-gated field effect transistors (MUGFETs) or a tri-gate device. A FinFET, for example, structurally includes, among other things, a gate that extends over and along a portion of each sidewall of a thin, vertical, silicon "fin." In FinFETS, a spacer is required for blocking implants at the gate edge and preventing silicide shorts to the gate. Conventional planar CMOS spacer processing presents a number of problems relative to the fin. In particular, if conventional spacer processes are used, fin erosion during spacer etch, is a potential problem. When the fin needs to be exceptionally thin, any additional etching can prevent attainment of the desired fin size. Another challenge is formation of a spacer having a uniform thickness such that the part of the fin not adjacent to the gate can be exposed to a uniform implantation. In conventional spacer etching, as shown in FIG. 1 in an illustrative finFET setting, a spacer 10 formed on a gate 12 over a fin 14 tends to have a narrower top than a bottom, resulting in non-uniform implantation of adjacent source-drain regions 16 in fin 14. Similar problems exist relative to other CMOS devices such as MUGFETs.

BRIEF SUMMARY

A first aspect of the disclosure provides a method comprising: forming a vertically disposed active region on a substrate; forming a first gate over a portion of the vertically disposed active region; forming a dielectric over the portion; exposing an upper surface of the first gate; forming a second gate over the upper surface; and forming a spacer pocket region between the vertically disposed active region, the first gate and the dielectric, wherein the spacer pocket region is self-aligned to a lower surface of the second gate and has a substantially uniform thickness from an upper to a lower extent thereof.

A second aspect of the disclosure provides a method comprising: forming a vertically disposed active region on a substrate; forming a first gate over a portion of the vertically disposed active region; forming a dielectric over the portion; exposing an upper surface of the first gate; forming a second gate over the upper surface; forming a mask that exposes the first gate and the dielectric; recessing the first gate and the dielectric; forming a spacer about the first gate, the dielectric and the vertically disposed active region; forming a pocket region between the vertically disposed active region, the first gate and the spacer, wherein the pocket region is self-aligned to a lower surface of the second gate and has a substantially uniform thickness from an upper to a lower extent thereof; and implanting a dopant into the vertically disposed active region.

A third aspect of the disclosure provides a transistor comprising: a vertically disposed active region on a substrate; a first gate over a portion of the vertically disposed active region; a dielectric adjacent to the first gate; a second gate coupled to an upper surface of the first gate; and a spacer pocket region between the vertically disposed active region, the first gate and the dielectric, wherein the spacer pocket region is self-aligned to a lower surface of the second gate and has a substantially uniform thickness from an upper to a lower extent thereof.

A fourth aspect includes a method comprising: forming a vertically disposed first structure; forming a first material layer over a portion of the vertically disposed first structure; forming a second material over the portion; removing the second material over an upper surface of the first material layer; forming a second structure over the upper surface; and forming a spacer pocket region between the vertically disposed first structure, the first material layer and the second material, wherein the spacer pocket region is self-aligned to a lower surface of the second structure and has a substantially uniform thickness from an upper to a lower extent thereof.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 3A-3B show cross-sectional view of the transistor along lines A-A and B-B, respectively, of FIG. 2.

FIGS. 3C-3D show cross-sectional view of the transistor along line CD-CD of FIG. 2.

FIGS. 4A-15A show cross-sectional views of different embodiments of the transistor along line A-A of FIG. 2 at various stages of a method according to embodiments of the invention.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As indicated above, the disclosure provides methods of forming a vertical spacer and a related transistor. The teachings of the invention will be described relative to a fin field effect transistor (FinFET), but are applicable to a variety of devices including, but not limited to multi-gated field effect transistors (MUGFETs) or tri-gate devices.

Figure 1:
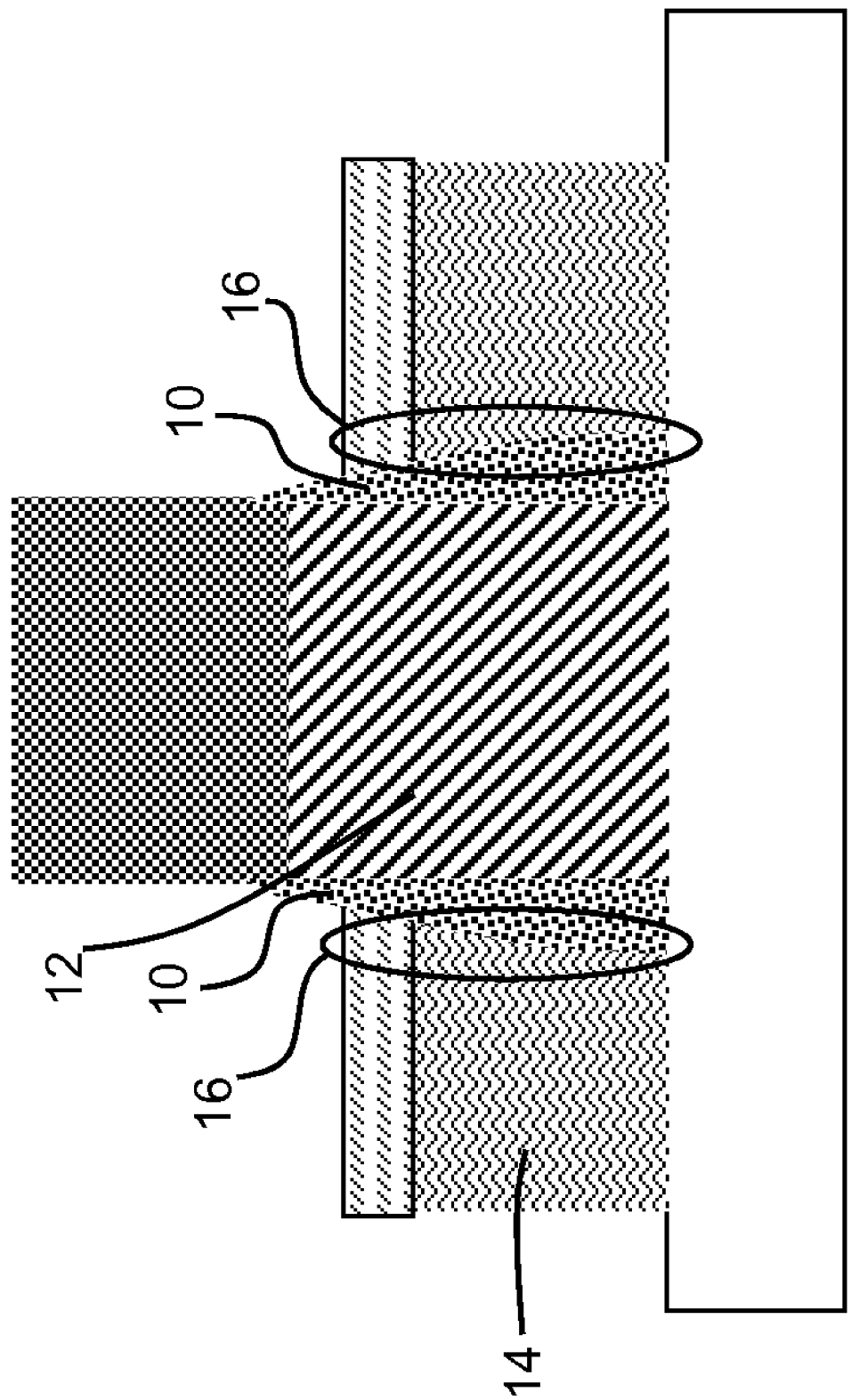
FIG. 1 shows a prior art transistor.
Figure 2:
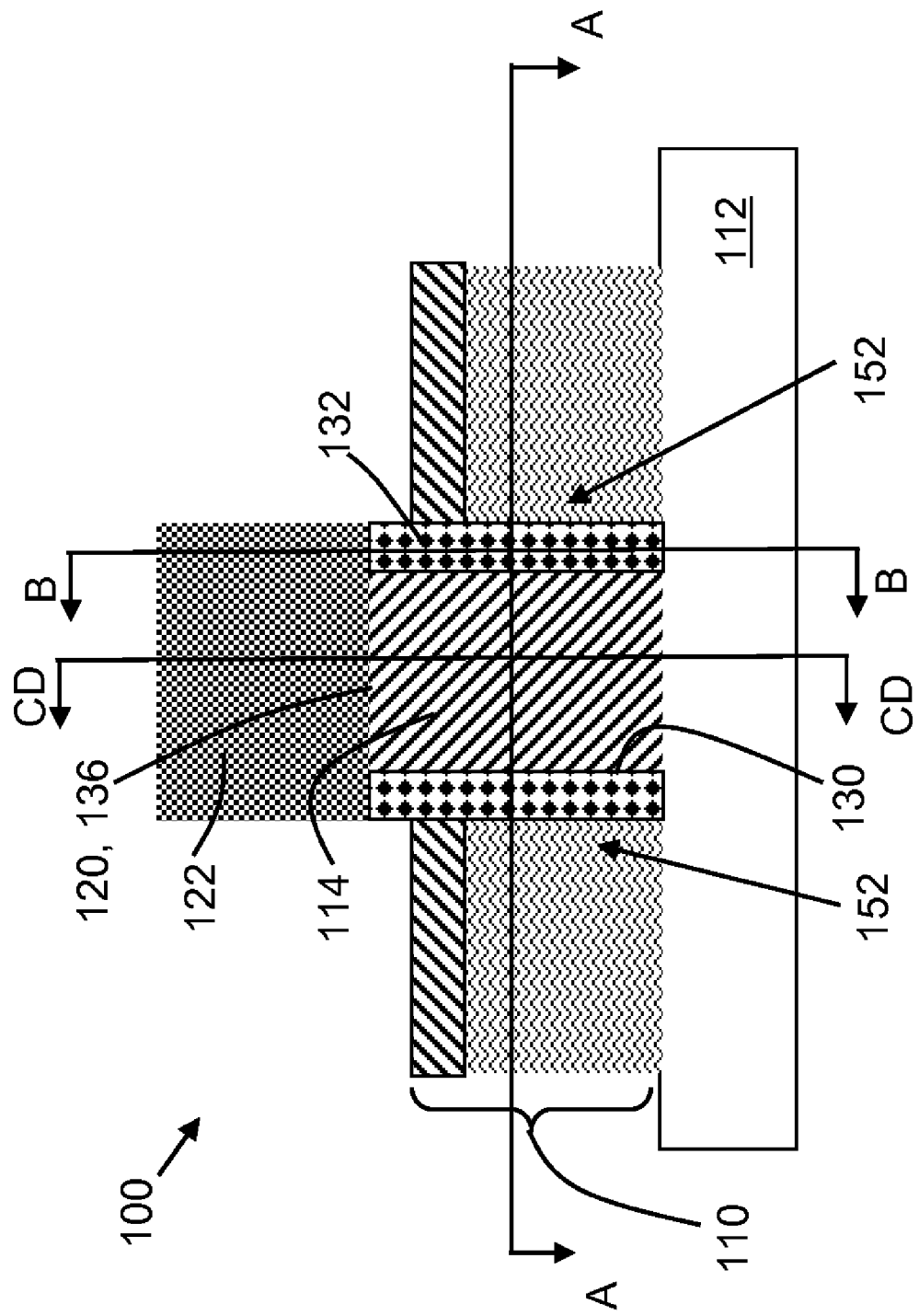
FIG. 2 shows a cross-sectional view of a transistor according to embodiments of the invention.

Referring to the drawings, embodiments of a method of forming a vertical spacer pocket region and/or spacer will now be described. FIG. 2 shows a transistor 100 formed using embodiments of the method in a finished form, with FIGS. 3A-3B showing cross-sectional views along lines A-A and B-B, respectively, of FIG. 2, and FIGS. 3C-3D show cross-sectional views along line CD-CD of FIG. 2 for different embodiments. In subsequent drawings, the figures are labeled with an A indicating a top-down, cross-sectional view along line A-A of FIG. 2.

FIGS. 3A-3D show a precursor structure 102 formed using any now known or later developed manner. Precursor structure 102 includes a vertically disposed first structure 110 on a substrate 112. First structure 110 will eventually present a vertically disposed active region in the instant illustrative application includes a fin of a finFET or MUGFET, and will be referred to hereinafter as a fin. Fin 110 may include a single material or a number of layers of material. In this setting, fin 110 includes a dielectric 116 (FIG. 3C) thereover. In a tri-gate setting, however, as shown in FIG. 3D, dielectric 116 is omitted. For brevity the rest of the description refers only to the FIG. 3C embodiment. It is understood, however, that the teachings are equally applicable to the FIG. 3D embodiment. Fin 110 may include but is limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 112 may take the form of a dielectric such as silicon oxide ($SiO_2$), and fin 110 and substrate 112 may be formed out of a semiconductor-on-insulator (SOI) substrate.

Also shown in FIGS. 3A-3C are a first gate 114 over a portion of fin 110, and a second material in the form of a dielectric 118 over the portion. First gate 114 may include a thin layer of a first material such as a metal, e.g., titanium nitride (TiN), tantalum aluminum nitride (TiAlN), tantalum nitride (TaN), tantalum silicon nitride (TaSiN), copper, aluminum, etc., having a thickness of approximately 1 nm to 30 nm. Dielectric 118 may include any now known or later developed inter-layer dielectric (ILD) such as, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available form JSR Corporation, other low dielectric constant (<3.9) material, or layers thereof.

As shown in FIGS. 2 and 3B only, an upper surface 120 of first gate 114 is exposed during processing such that a second structure in the form of a second gate 122 can be formed over and coupled to upper surface 120. Second gate 122 may include a second gate material such as those described above relative to fin 110, e.g., polysilicon, or a metal as described above relative to first gate 114. First gate 114 and second gate 122 form a unified gate structure for transistor 100.

Figures 4A, 5A:
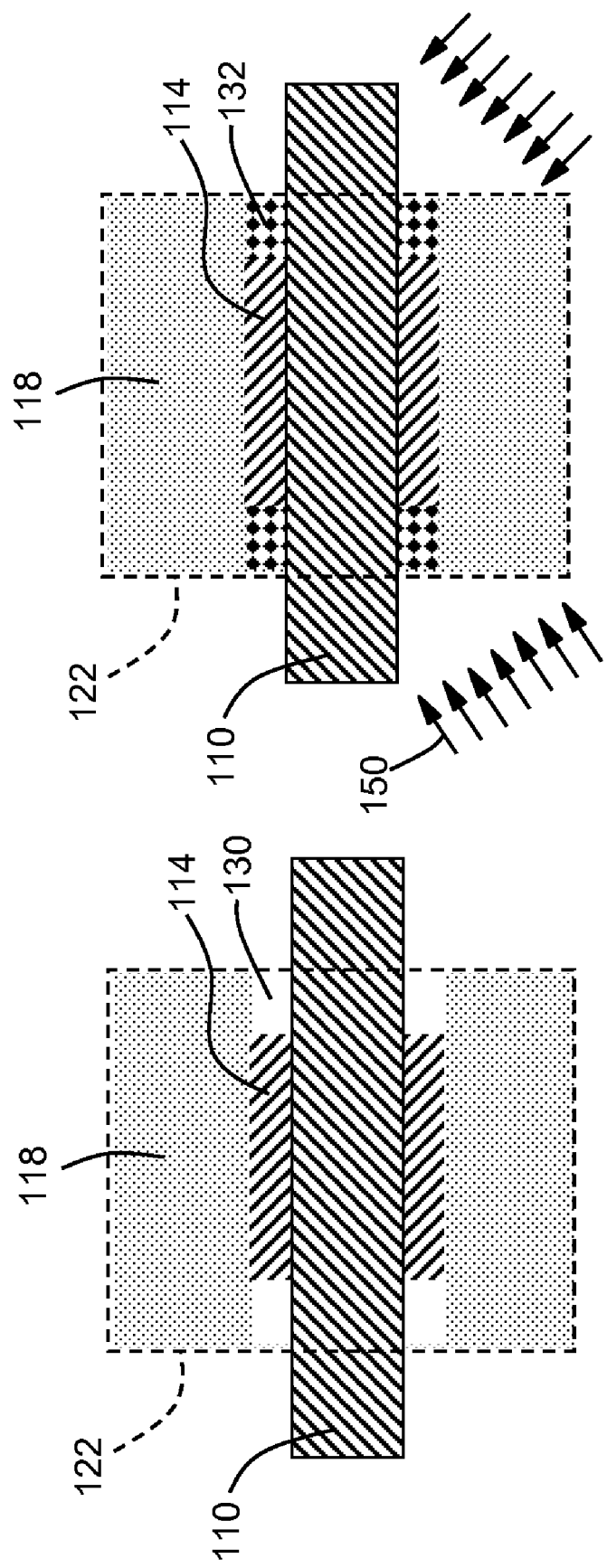

Turning to FIGS. 4A and 5A, forming a spacer pocket region 130 and/or a spacer 132 follows the above-described processing. (In FIGS. 4A-15A, an outline of second gate 122 is shown in phantom.) In each embodiment, as shown best in FIG. 2, spacer pocket region 130 (FIG. 4A), and/or spacer 132 (FIG. 5A) is formed between fin 110, first gate 114 and dielectric 118 (FIGS. 4A-5A only), and is self-aligned to a lower surface 136 (FIG. 2) of second gate 122. In contrast to conventional spacers, spacer 132 (and spacer pocket region 130) has a substantially uniform thickness from an upper to a lower extent thereof. Consequently, subsequent implanting 150 of a dopant, as shown in FIG. 5A, results in a more uniform doping of active regions 152 (FIG. 2) in fin 110.

Spacer pocket region 130 may be formed using an etch that is selective to the first gate material (typically a wet etch) while having limited etching of surrounding materials to form an opening in first gate 114. Spacer 132 may be formed by depositing a dielectric such as silicon nitride, and etching to form the spacer. The dopants used during implanting 150 may vary depending on the particular electrical characteristics required. N-type dopants may include but are not limited to: phosphorous (P), arsenic (As), antimony (Sb); and p-type dopants may include but are not limited to: boron (B), indium (In) and gallium (Ga). Note, implanting 150 is shown only on the bottom portions of each figure for clarity purposes only; the implanting also occurs on the other side of fin 110.

The timing of the above-described processes may vary to accommodate different situations. For example, referring to FIG. 6A, in one embodiment, implanting 150 occurs prior to spacer pocket region 130 (FIGS. 2 and 4A) forming. That is, implanting 150 occurs before the masking and etching to form spacer pocket region 130. Consequently, active regions 152 are formed outside of where spacer 132 will eventually be formed.

Figure 9A:
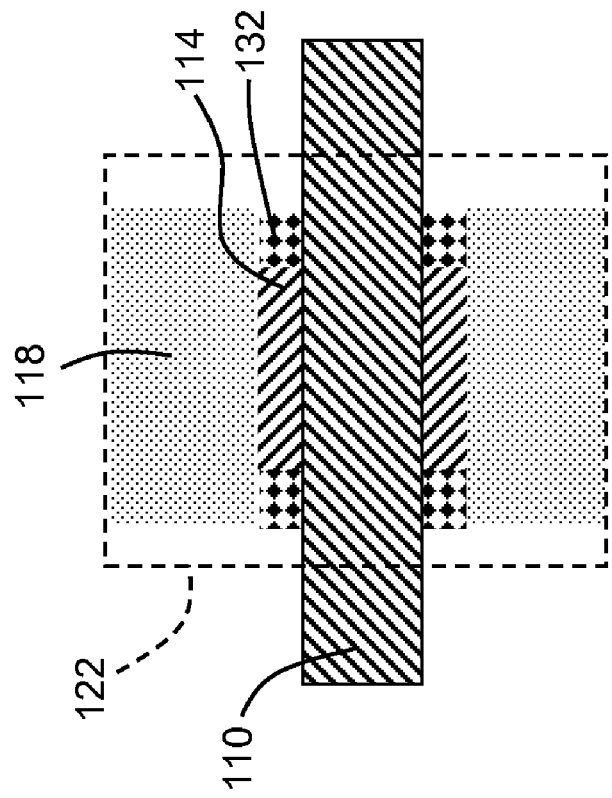
Figure 8A:
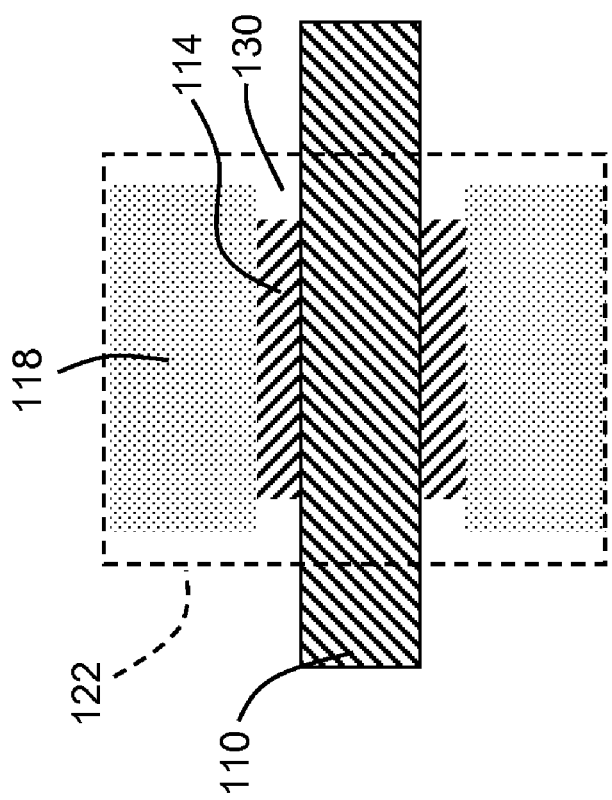

Referring to FIGS. 7A-9A, in another embodiment, implanting 150 may occur between a first recessing of dielectric 118 only (FIG. 7A) and a second recessing of first gate 114 that forms spacer pocket region 130 (FIG. 8A). That is, the etching that forms spacer pocket region 130 may be segmented into a first etching of dielectric 118 only (illustrated by gap between edge of second gate 122 and dielectric 118 in FIG. 7A), followed by implanting 150 (FIG. 7A), and then etching of first gate 114 (FIG. 8A), the latter of which ultimately forms spacer pocket region 130. FIG. 9A shows this embodiment after formation of spacer 132. "Recessing" as used herein means applying any appropriate masks to protect un-recessed areas, and performing an appropriate etching technique for the materials to be etched.

Figure 11A:
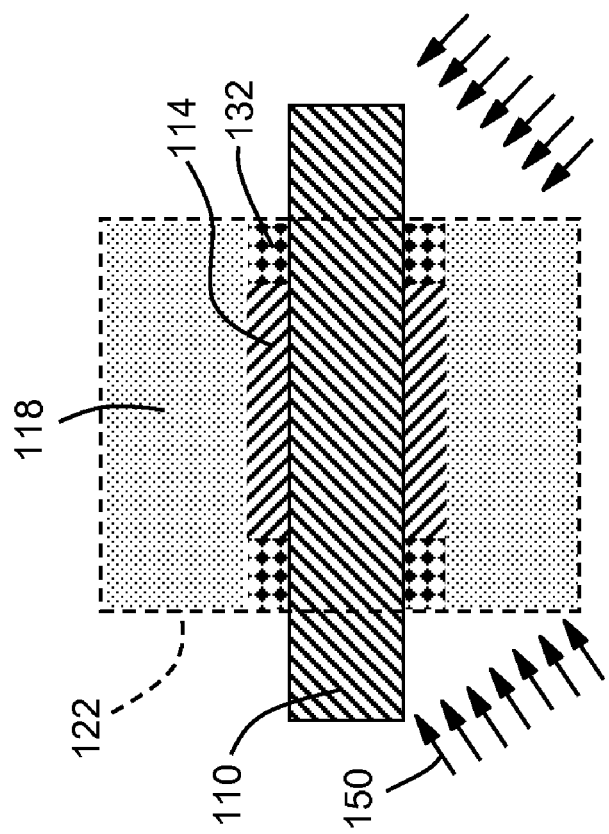
Figure 10A:
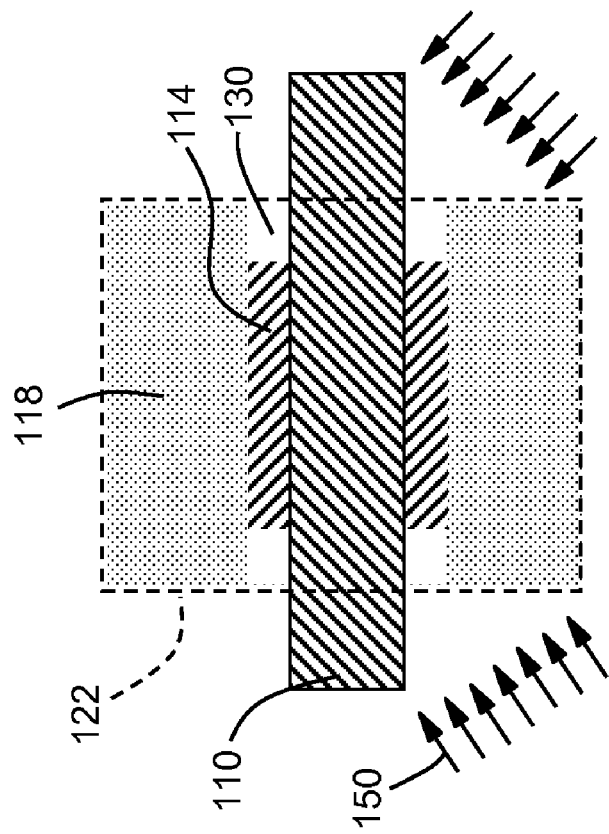
Figure 12A:
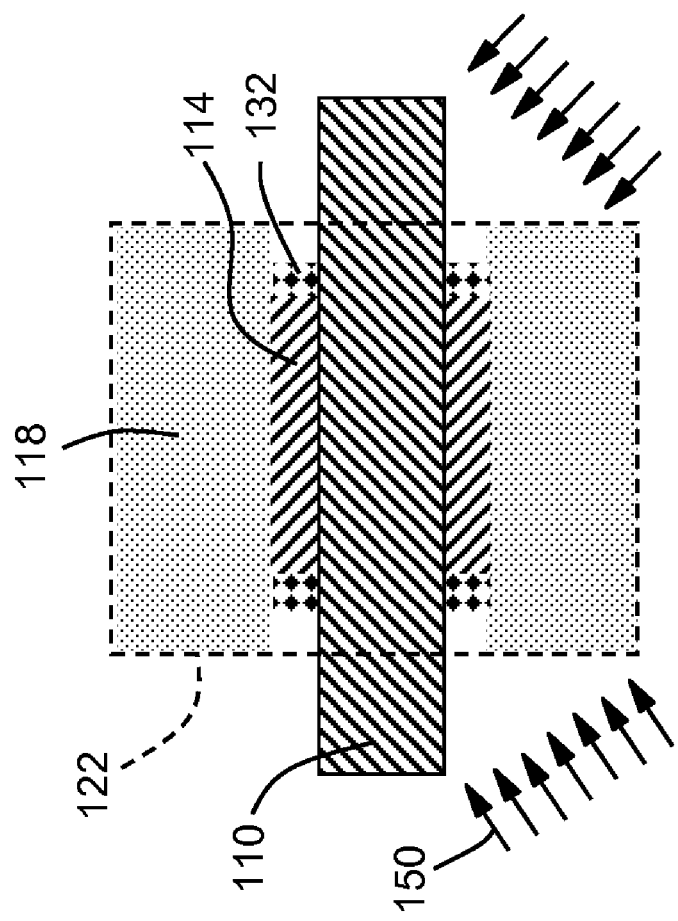
Figure 15A:
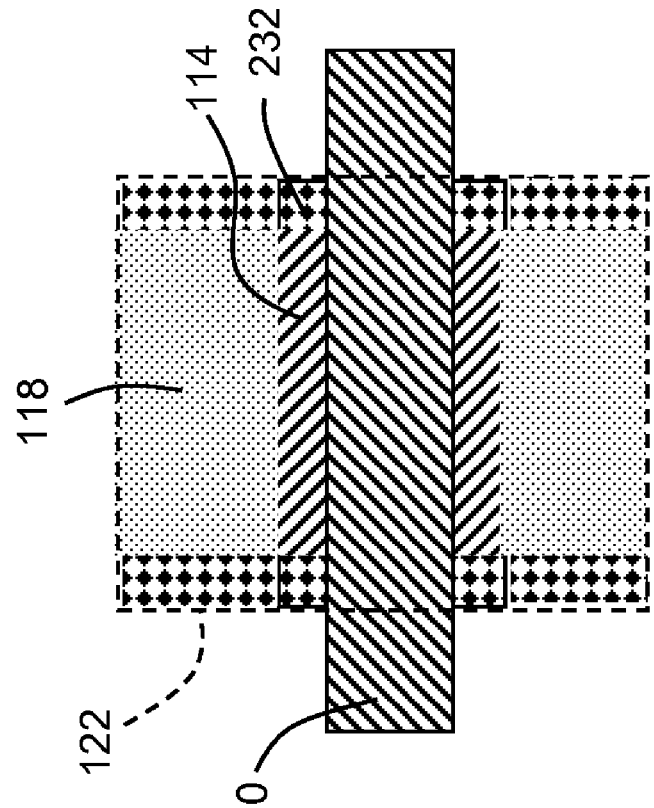
Figure 14A:
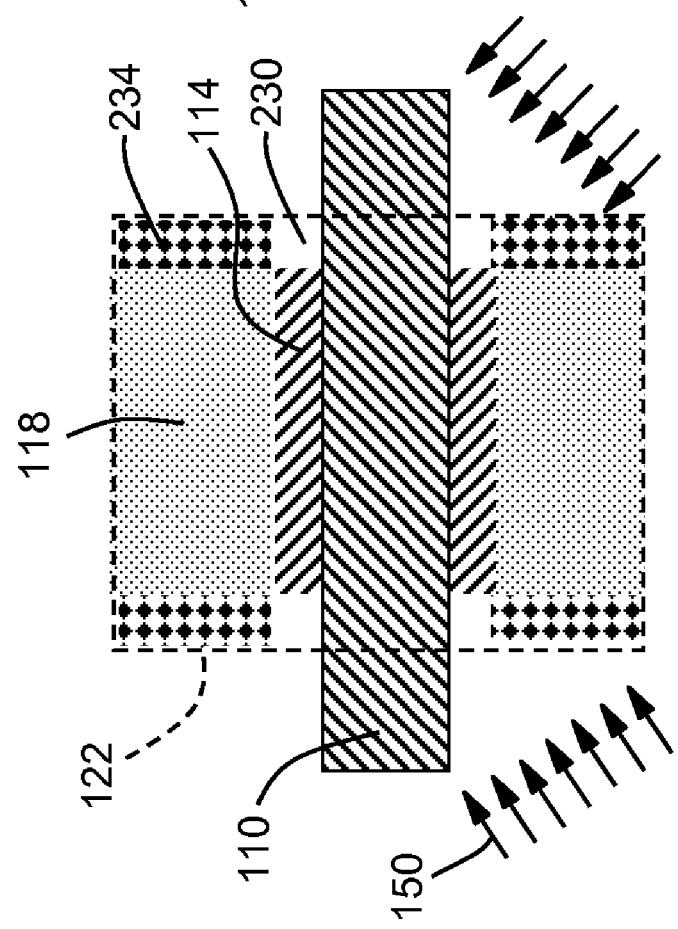

In the FIG. 10A embodiment, spacer pocket region 130 forming includes recessing first gate 114, and implanting after the spacer pocket region 130 forming. FIG. 11A illustrates forming spacer 132 in spacer pocket region 130 after the spacer pocket region forming and prior to implanting 150. (This embodiment is the same as that shown in FIG. 5A). FIG. 12A illustrates another embodiment in which spacer 132 is recessed (shown by white-space between second gate 122 and spacer 132) after formation thereof, but prior to implanting 150.

Figure 13A:
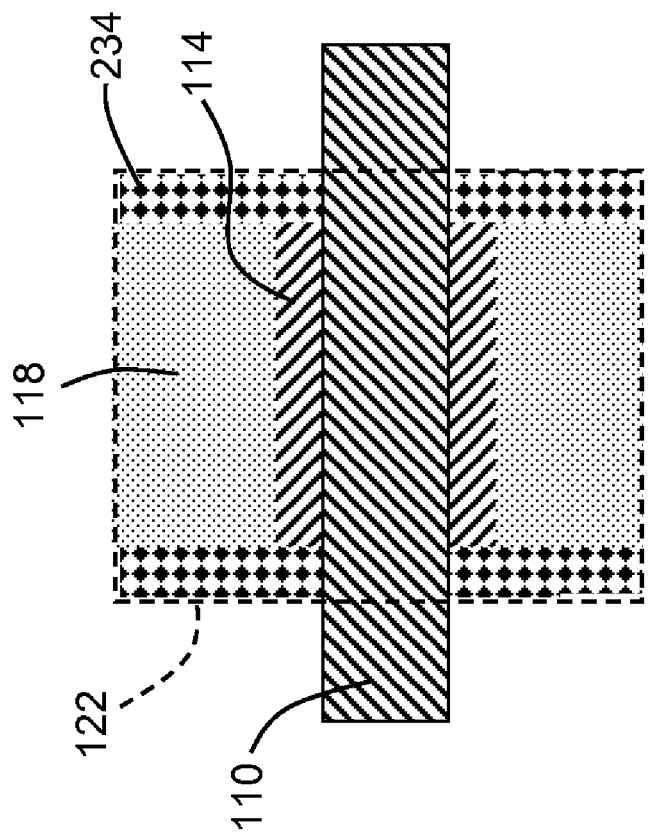

Referring to FIGS. 13A-15A, in an alternative embodiment, the processes to form precursor structure 102 (FIG. 2) may be carried out as described above. That is, forming fin 110 on substrate 112, forming first gate 114 over a portion of fin 110, forming dielectric 118 over the portion, exposing upper surface 120 of the first gate, and forming second gate 122 over the upper surface. In the FIGS. 13A-15A embodiment, a mask (not shown) may be formed that exposes first gate 114 and dielectric 118, and then both structures may be recessed (illustrated by their not being aligned with second gate 122) using appropriate etching techniques. As shown in FIG. 13A, a spacer 234 may then be formed about first gate 114, dielectric 118 and fin 110. As shown in FIG. 14A, a pocket region 230 is then formed between fin 110, first gate 114 and spacer 234. As before, pocket region 230 is self-aligned to a lower surface 136 (FIG. 2) of second gate 122 and has a substantially uniform thickness from an upper to a lower extent thereof. Implanting 150 of a dopant into fin 110 may then occur. This embodiment may be advantageous where the thick (inter-gate) dielectric 118 is weak (such as porous low K) and needs a protective layer, and/or where dielectric 118 does not block implants well. As shown in FIGS. 14A-15A, pocket region 230 may be subsequently filled with a spacer 232.

Returning to FIG. 2, based on the above-described methodologies, transistor 100 includes a vertically disposed active region 110 (fin) on substrate 112. A first gate 114 is positioned over a portion of fin 110. Dielectric 118 is adjacent to first gate 114, and may cover a portion thereof as shown in FIG. 16. Second gate 122 is coupled to upper surface 120 of first gate 114. Spacer pocket region 130 and/or spacer 132 is positioned between fin 110, first gate 114 and dielectric 118. Pocket region 130 is self-aligned to lower surface 136 of second gate 122 and has a substantially uniform thickness from an upper to a lower extent thereof.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   forming a vertically disposed active region on a substrate;
   forming a first gate over a portion of the vertically disposed active region;
   forming a dielectric over the portion;
   exposing an upper surface of the first gate;
   forming a second gate over the upper surface;
   forming a spacer pocket region between the vertically disposed active region, the first gate and the dielectric,
   wherein the spacer pocket region is self-aligned to a lower surface of the second gate and has a substantially uniform thickness from an upper to a lower extent thereof; and
   implanting a dopant into the vertically disposed active region, wherein the implanting occurs between a first recessing of the dielectric only and a second recessing of the first gate that forms the spacer pocket region.

2. The method of claim 1, further comprising forming a spacer in the spacer pocket region.

3. The method of claim 2, wherein the spacer forming includes depositing a dielectric and etching to form the spacer.

4. The method of claim 1, wherein the implanting occurs prior to the spacer pocket region forming.

5. The method of claim 1, wherein the spacer pocket region forming includes recessing the first gate, and the implanting occurs after the spacer pocket region forming.

6. The method of claim 5, further comprising forming a spacer in the spacer pocket region after the spacer pocket region forming and prior to the implanting.

7. The method of claim 6, further comprising recessing the spacer prior to the implanting.

8. A method comprising:
   forming a vertically disposed active region on a substrate;
   forming a first gate over a portion of the vertically disposed active region;
   forming a dielectric over the portion;
   exposing an upper surface of the first gate;
   forming a second gate over the upper surface;
   forming a mask that exposes the first gate and the dielectric;
   recessing the first gate and the dielectric;
   forming a spacer about the first gate, the dielectric and the vertically disposed active region;
   forming a pocket region between the vertically disposed active region, the first gate and the spacer, wherein the pocket region is self-aligned to a lower surface of the second gate and has a substantially uniform thickness from an upper to a lower extent thereof; and
   implanting a dopant into the vertically disposed active region, wherein the implanting occurs between a first recessing of the dielectric only and a second recessing of the first gate that forms the spacer pocket region.

9. The method of claim 8, further comprising forming a spacer in the pocket region.

10. The method of claim 9, wherein the spacer forming includes depositing a dielectric and etching to form the spacer.

11. A transistor comprising:
    a vertically disposed active region on a substrate;
    a first gate over a portion of the vertically disposed active region;
    a dielectric adjacent to the first gate;

a second gate coupled to an upper surface of the first gate; and a spacer pocket region between the vertically disposed active region, the first gate and the dielectric, wherein the spacer pocket region is self-aligned to a lower surface of the second gate and has a substantially uniform thickness from an upper to a lower extent thereof, and wherein the vertically disposed active region includes a dopant implanted between a first recess of the dielectric only and a second recess of the first gate that forms the spacer pocket region.

12. The transistor of claim 11, wherein the spacer pocket region includes a spacer therein.

13. A method comprising:

forming a vertically disposed first structure;

forming a first material layer over a portion of the vertically disposed first structure;

forming a second material over the portion;

removing the second material over an upper surface of the first material layer;

forming a second structure over the upper surface;

forming a spacer pocket region between the vertically disposed first structure, the first material layer and the second material, wherein the spacer pocket region is self-aligned to a lower surface of the second structure and has a substantially uniform thickness from an upper to a lower extent thereof, wherein the first structure is a fin of a FinFET, the first material layer includes a first gate material, the second material includes a dielectric and the second structure includes a second gate material and is contiguous with the first gate material; and implanting a dopant into the fin, wherein the implanting occurs between a first recessing of the dielectric only and a second recessing of the first gate material that forms the spacer pocket region.

14. The method of claim 13, further comprising forming a spacer in the spacer pocket region.

15. The method of claim 14, wherein the spacer forming includes depositing a dielectric and etching to form the spacer.

16. The method of claim 13, wherein the implanting occurs prior to the spacer pocket region forming.

17. The method of claim 13, wherein the spacer pocket region forming includes recessing the first gate material, and the implanting occurs after the spacer pocket region forming.

18. The method of claim 17, further comprising forming a spacer in the spacer pocket region after the spacer pocket region forming and prior to the implanting.

19. The method of claim 18, further comprising recessing the spacer prior to the implanting.

* * * * *